US006282692B1

(12) United States Patent
Rubin

(10) Patent No.: US 6,282,692 B1
(45) Date of Patent: Aug. 28, 2001

(54) STRUCTURE FOR IMPROVED CAPACITANCE AND INDUCTANCE CALCULATION

(75) Inventor: Barry J. Rubin, Croton-on-Hudson, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/204,687

(22) Filed: Dec. 3, 1998

(51) Int. Cl.[7] ....................................................... G06F 17/50
(52) U.S. Cl. .................................................. 716/4; 716/12
(58) Field of Search ............................................ 716/1–21

(56) References Cited

U.S. PATENT DOCUMENTS

| | | | |
|---|---|---|---|
| 4,811,237 | * 3/1989 | Putatunda et al. | 716/9 |
| 5,469,366 | * 11/1995 | Yang et al. | 716/6 |
| 5,475,606 | * 12/1995 | Muyshondt et al. | 716/19 |
| 5,623,420 | * 4/1997 | Yee et al. | 716/1 |

OTHER PUBLICATIONS

W. T. Weeks et al., "Resistive and Inductive Skin Effect in Rectangular Conductors", IBM J. of Res. Develop., vol. 23, No. 6, pp. 652–660, No Date.*
Pierce A. Brennan et al., "Three–dimensional Inductance Computations with Partial Element Equivalent Circuits", IBM J. of Res. Develop., vol. 23, No. 6, pp. 661–668, No Date.*
WInkler, "Escape routing from chip scale packages", Nineteenth IEEE/CPMT Electronics Manufacturing Technology Symposium, pp. 393–401, Oct. 1996.*
Mathis et al., "Modeling and analysis of interconnects within a package incorporating vias and a perforated ground plane", Proceedings of the 46th Electronic Components and Technology Conference, pp. 984–990, May 1996.*
Ladd et al., "SPICE simulation used to characterize the cross–talk red effect of additional tracks grounded with vias on printed boards", IEEE Transactions on Circuits and Systems II: Analog and Digital Signal Processing, vol. 39, No. 6, pp. 342–347, Jun. 1992.*
"Inductance Calculations in a Complex Integrated Circuit Environment", by A. E. Ruehli, IBM J. Res. Develop. Sep. 1972, pp. 470–481.

* cited by examiner

*Primary Examiner*—Matthew Smith
*Assistant Examiner*—Phallaka Kik
(74) *Attorney, Agent, or Firm*—Scully, Scott, Murphy & Presser; Daniel P. Morris, Esq.

(57) ABSTRACT

A methodology and circuit modeling structure for analyzing the packaging of electrical circuits and determining electrical circuit properties, e.g., inductance, capacitance, of circuits and circuit structures found in VLSI chips, PC cards, boards, microwave circuits, etc. The methodology and circuit modeling structure includes modifying the original signal line structure in the circuit to be analyzed by including a shadow line structure in the analyzed circuit and locating the shadow line structure between a ground plane structure and an associated signal line structure at an infinitesimal distance above the ground plane. Additionally, for each shadow line structure, there is provided a first via structure for connecting a first end of said shadow line to the ground plane and, a second via structure connecting a second end of the shadow line to the ground plane. The modified shadow line structure is readily implemented in 3D circuit package analysis programs and provides a computationally efficient way to analyze complex types electrical/electronic/packaging circuits and structures.

28 Claims, 2 Drawing Sheets

FIG. 3

| CASE | GRID | L11 (nH) h=0.1 cm | L12 (nH) h=0.1 cm | L22 (nH) h=0.1 cm | L11 (nH) h=1.0 cm | L12 (nH) h=1.0 cm | L22 (nH) h=1.0 cm | COMMENTS |
|---|---|---|---|---|---|---|---|---|
| 2D STRUCTURE | FINE, NONUNIFORM | 59.88 | 0.282 | 59.88 | 124.26 | 15.61 | 124.26 | 2D C CALCULATION |
| ORIGINAL | 2x | 82.87 | -1.967 | 81.42 | 127.99 | 15.06 | 129.27 | |
| ORIGINAL | 1x | 76.23 | 0.712 | 76.26 | 127.67 | 15.11 | 129.01 | |
| ORIGINAL | 0.5x | 67.72 | 0.261 | 67.76 | 127.62 | 15.15 | 129.27 | |
| ORIGINAL | 0.25x | 63.08 | 0.240 | 63.22 | 127.62 | 15.17 | 129.41 | |
| modified_1 | 2x | 67.33 | -0.273 | 67.06 | 127.90 | 15.10 | 129.21 | |
| modified_1 | 1x | 63.29 | 0.149 | 63.20 | 127.85 | 15.12 | 129.17 | |
| modified_2 | 2x | 65.75 | 0.289 | 65.78 | 127.65 | 15.12 | 128.99 | 0.1, 0.3 cm SHADOW WIDTH |
| modified_2 | 1x | 62.91 | 0.231 | 62.88 | 127.64 | 15.12 | 128.99 | 0.1, 0.3 cm SHADOW WIDTH |

STRUCTURE FOR IMPROVED CAPACITANCE AND INDUCTANCE CALCULATION

BACKGROUND OF THE INVENTION

1. Field of the Invention

The present invention relates to the electrical/electronic device packaging arts in general, including manufacture of printed circuit cards and boards, and more particularly, to an improved structure for calculating the capacitance and inductance of a wide variety of structures found in computers, microwave and other electronic devices.

2. Discussion of the Prior Art

The computation of electrical properties, e.g., capacitance and inductance, is a central part of modeling behavior of electrical circuits and structures found in VLSI chip and package interconnects as well as microwave circuits, PC cards, boards, ceramic and other chip carriers. These structures typically include: conductors, arranged as signal lines that are predominantly rectangular in nature and can be subdivided into rectangular subsections for the purposes of electrical analysis; ground (power) planes, and vias for interconnecting the signal lines or ground planes which also may be approximated as rectangular, and an insulating dielectric. Depending on the application, the signal line structures lie in planes parallel to the ground planes and may run at arbitrary angles, e.g., 45°, relative to the ground plane. In addition, the ground plane may be solid or have cutouts (apertures).

Present inductance calculation techniques for 3-dimensional structures typically involve calculating a return current distribution using a numerical simulation of the structure and a given numerical grid which subdivides the structure into cells, with each cell supporting a constant current. Assuming a highly accurate numerical technique, e.g., the method-of-moments technique, the calculated results when utilizing an ultra-fine grid should be the same as the true current distribution, which may be obtained, e.g., by direct measurement. As known, the method-of-moments technique involves the generation and subsequent solution of a matrix equation with the currents on each cell as the unknowns. Thus, for a 3D example structure including an x-y finite ground plane apportioned as rectangular grid having 20×20 current elements, with each current element having a unit current and an associated coefficient in both x and y directions, a current distribution calculation in the ground plane would involve the solution of a matrix of equations with about 800 unknowns. Generating more accurate results for the current distribution generally requires the implementation of a ground plane portion having a finer current element grid, e.g., 40×40. In the case of a 40×40 current element grid, for example, the current distribution calculation would require the solution of a matrix equation having about 3200 unknowns. As can be surmised, a grid sufficiently fine for accurate results increases computation run time and storage requirements, e.g., when implementing standard techniques, doubling the number of unknowns yields a factor of eight increase in run time and a factor of four increase in storage requirements. Oftentimes, the problem to be solved becomes too large to run.

When the modeled structure consists of diagonal lines run over a finite ground plane, further problems are introduced because the rectangles into which the ground plane and signal line are subdivided do not overlap in a projection sense. Because of this, the return current that must exist in the ground plane cannot closely enough match the true current. That is, the return current is more stair-case in nature as opposed to smoothly diagonal, and this in general leads to higher values of self inductance and substantial errors in the coupling inductance calculations. The problem becomes more severe as the signal lines get closer to the ground planes or other signal lines. Simulations demonstrate that the problem occurs when the height of the signal line above the ground plane is less than the grid size associated with the rectangles in the ground plane. Under these circumstances, accurate solutions can only be obtained using very fine grids which leads to excessive computer run times and storage requirements.

The accuracy of the method of moments solution for structures involving diagonal lines has heretofore not been sufficiently addressed by those in this art. Alternative solutions to the problem exist, and include the use a finer ground plane grid, the use of a more general set of basis functions in the moment-method analysis, and the use of other analysis techniques, such as finite element. The last two alternatives make use of non-rectangular basis functions, such as triangles or tetrahedrals. The use of such basis functions allows both the diagonal line and ground plane to be sectioned in such a way that the return current can be accurately modeled, however, problems exist with all of these alternatives. For example, codes that employ triangular or other basis functions are generally inferior to those based on rectangular basis functions when applied to structures that are predominantly rectangular in nature; they are not as accurate, may introduce false asymmetries, and require more unknowns to model rectangular regions. The finite element technique is not appropriate for all problems, especially those that involve high aspect ratios, and this occurs when long and narrow signal lines are present. Further, the use of such techniques, even when appropriate, means that additional codes must be purchased or developed by the entity performing the modeling. Once employed, these results must be reconciled against those of rectangular structures where the rectangle-based tools were used.

For capacitance calculations, a similar set of arguments apply, except a charge distribution is considered rather than current distribution.

It would be desirable to provide a highly accurate technique for analyzing electrical circuit properties, e.g., inductance and capacitance, of circuits and device structures that is computationally efficient and readily implementable in conventional 3D package analysis programs.

It would be desirable to provide a highly accurate technique for analyzing electrical circuits and structures that lie diagonal with respect to a finite ground plane.

SUMMARY OF THE INVENTION

The present invention is directed to a methodology and circuit modeling structure for analyzing the packaging of electrical circuits and determining electrical circuit properties, e.g., inductance and capacitance, of circuits and circuit structures found in VLSI chips, PC cards, boards, microwave circuits, etc. The methodology and circuit modeling structure is readily implemented in 3D circuit package analysis programs and provides a computationally efficient way to analyze complex types electrical/electronic/packaging circuits and structures. Such circuits and structures include those electrical structures that lie diagonally with respect to a finite ground plane. Such a circuit modeling structure is readily implementable in analysis techniques, including method-of-moments, and finite element analysis.

According to the principles of the invention there is provided a system and method for automatically improving the computational accuracy of electrical properties associated with an electrical circuit including a signal line structure capable of carrying current and a ground plane for having a return current distribution, including: locating one or more signal line structures each for carrying current near a ground plane structure and located a distance h relative thereto; associating one or more shadow line structures with each signal line structure and locating the one or more shadow line structures an infinitesimal distance above or below said ground plane running in parallel with its associated signal line structure, the ground plane and associated shadow line structures defined as carrying return current; each shadow line structure having a first via structure for connecting a first end of the shadow line to the ground plane, and a second via structure connecting a second end of the shadow line to the ground plane; and, inputting the ground plane, signal line, shadow line, and respective first and second via structures into an analysis program for performing electrical circuit parameter calculation for a portion of the circuit comprising the one or more signal lines and the ground plane; and, utilizing the return current in the calculation of the electrical circuit parameter, wherein a computational efficiency is achieved as a larger portion of the return current is contributed by the shadow line structures.

Advantageously, the method described herein may be fully automated, may be performed transparent to the user, and furthermore may be implemented in a variety of software programs incorporating different electrical parameter calculation techniques, including method-of-moments, finite analysis, etc. Furthermore, for diagonal structures, computational accuracy is increased using the same ground plane gridding as for an entirely rectangular structure, i.e., one without diagonal lines. Faster and more efficient solutions are possible and larger, more complex structures may be analyzed.

BRIEF DESCRIPTION OF THE DRAWINGS

Further features and advantages of the invention will become more readily apparent from a consideration of the following detailed description set forth with reference to the accompanying drawings, which specify and show preferred embodiments of the invention, wherein like elements are designated by identical references throughout the drawings; and in which.

DETAILED DESCRIPTION OF THE INVENTION

Figure 1:
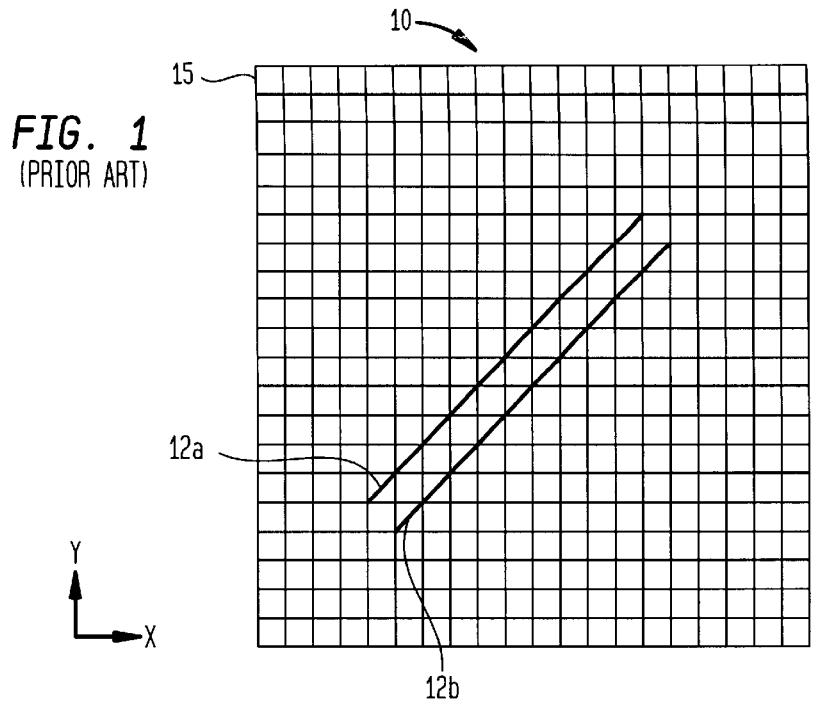
FIG. 1 is an example circuit structure including two signal lines situated above a rectangular ground plane.

The preferred embodiments of the invention is now described herein by way of example, for the case of an inductance calculation. As shown in FIG. 1, a simple structure 10 consists of two signal lines 12a, 12b that are parallel to each other and lie on the same plane, but run diagonally with respect to a rectangular ground plane 15 a distance below. In its simplest form, the invention is directed to a modification of the original structure with the addition of extra conductors, referred to herein as "shadow lines," that run in the same direction as the signal lines, but lie infinitesimally close to and are shorted through vias 18 at each end to the ground plane below.

Figure 2A:
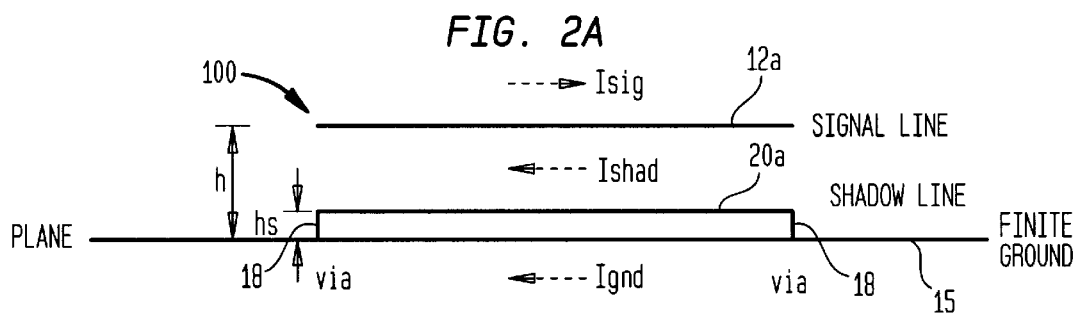
FIG. 2(a) is a shadow line structure according to a first embodiment of the invention.

The concept of shadow lines for the sample structure of FIG. 1, is depicted in FIG. 2(a). As shown in FIG. 2(a), for the original conductor 12a running over a finite section of ground plane 15 at a height "h", a corresponding shadow line structure 20a is provided that runs in the same direction as the signal line, but lies infinitesimally close to and is shorted through vias 18 at each end to the ground plane 15 below. The distance at which the shadow line 20a lays above the ground plane is represented by a distance "hs" and, for example, may be approximately equal to $10^{-4} \times h$, i.e., hs=1× $10^{-4} \times h$. In the preferred embodiment, the distance "hs" is intended to be negligible compared to "h," but is shown larger in FIG. 2(a) for purposes of explanation. Additionally, for ease of explanation, it may be assumed that the thickness of the shadow line structures is infinitesimally small, such that, for calculation purposes, may range between 0 (zero) and $10^{-5} \times h$. The vias 18 are connections that short the shadow line 20a to the ground plane 15 at each end and may be represented as a conducting strip of zero thickness having a width comparable to that of the signal line. Furthermore, the via structures 18 may be limited to run in the x, y, z directions, according to a particular numerical analysis program implemented. Because the vias have infinitesimal height "hs," their inductance is negligible.

As further shown in FIG. 2(a), the current through signal line 12a is Isig. In the methodology of the invention, the return current has two contributions, a ground plane current, Ignd, and a shadow line current, Ishad, with the predominant return current component being Ishad. The superposition of Ishad and Ignd in the modified structure 100 of FIG. 2(a), is virtually the same as the current in the original structure (i.e. without the shadow line and vias). When analyzed numerically, the superposition of Ishad and Ignd is much closer to the true current than is the case when the original structure is similarly analyzed. That is, through numerical simulation of the structure using a given numerical grid, the calculated current distribution may be obtained, e.g., the numerical grid subdivides the structure into cells, each cell supporting a constant current. Assuming a highly accurate numerical technique, the calculated results for an ultra-fine grid are virtually the same as the true current distribution. Preferably, the calculations are performed using the method-of-moments technique involving the generation and subsequent solution of a matrix equation with the currents on each cell as the unknowns. It should be understood that current is also present in the original signal line structure, which current is also to be figured into the electrical parameter analysis computations.

By permitting a return current distribution in the ground plane 15 and shadow line 20a, the invention allows the calculated current to much more closely resemble that of the true current distribution. This is because of the presence of the shadow line, where, in the numerical analysis, the return current is substantially comprised within the shadow line. Thus, the diagonal component of the current in the ground plane as shown in FIG. 1, is much smaller, so that errors associated with the staircase current approximation are reduced. Particularly, the modified structure, though containing the shadow line, has virtually the same inductance as the original structure. This is due to the fact that the inductance for a structure is associated with the current distribution that minimizes the energy in the magnetic field. Because the current in the shadow line 20a is only an infinitesimal distance from the ground plane, the magnetic field produced by the total return current [that contained in the ground plane and shadow line(s)] is the same no matter how the current is split between the ground plane and shadow line.

Figure 2B:
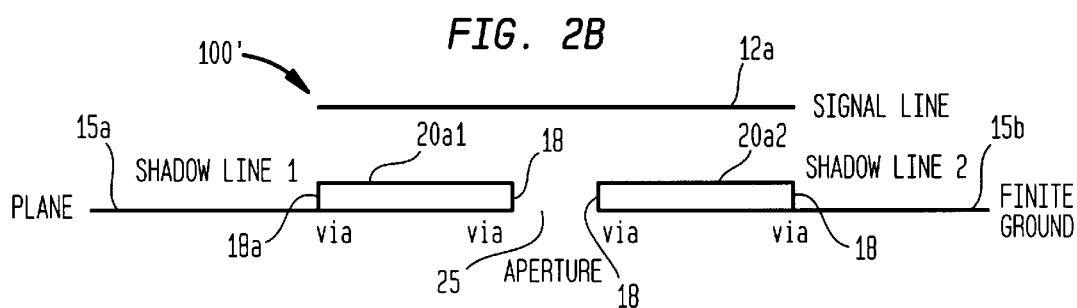
FIG. 2(b) is a shadow line structure according to a second embodiment of the invention, wherein the ground plane contains apertures.

The modified circuit structure 100', as depicted in FIG. 2(b), illustrates the circuit whereby the original signal line 20a runs over a ground plane that has an aperture 25, thus breaking the finite ground plane into two areas 15a and 15b when viewed along a sectional line through the aperture as shown in FIG. 2(b). For this analysis, two shadow lines 20a1 and 20a2 are employed as shown in FIG. 2(b), with shadow line 20a1 substantially located over corresponding conductive region 15a of the ground plane and, shadow line 20a2 substantially located over corresponding conductive region 15b of the ground plane. Together, the shadow lines 20a1 and 20a2 allow the return current to follow the signal line, but only in regions where the ground plane is conductive. Had a shadow line been placed over the aperture, a fictitious current across the aperture would exist and the modified structure would not have the same inductance as the original structure, yielding incorrect results in the subsequent numerical analysis of the modified structure.

In accordance with the principles of the invention, it is the case that for a ground plane 15 having substantial thickness, shadow lines may be placed just above and just below the top and bottom surfaces, respectively, of the ground plane. Further, for the case of apertures in a ground plane having thickness, more than one shadow line may be placed above the ground plane and more than one shadow line may be placed below the ground plane with vias connecting the respective shadow line ends to the ground plane. Additionally, for cases where diagonal lines on different x-y layers cross, then the shadow lines may be placed at different heights, hs, so that they too would cross but not touch. For cases where multiple diagonal lines exist on the same x-y layer and cross and touch, the shadow lines may still be placed at different heights, hs, but the vias connecting the shadow lines to the ground plane would also be placed at positions corresponding to the crossing region; these vias would properly permit a conduction current between the crossing shadow lines.

Figure 2C:
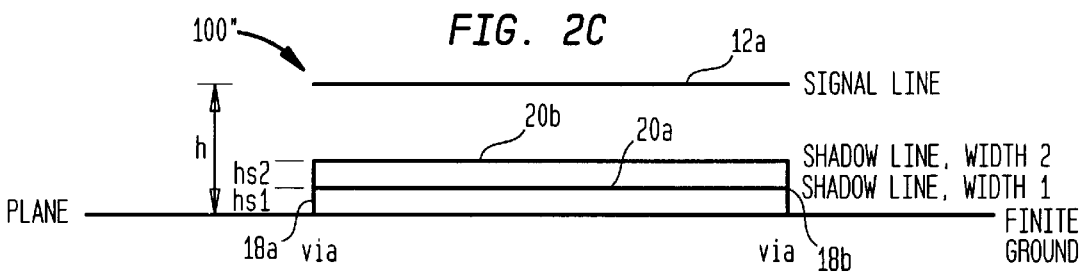
FIG. 2(c) is a preferred shadow line structure according to a third embodiment of the invention; and, FIG. 3 illustrates the results of calculated inductances for two example structures each comprising two coupled lines above a finite ground plane as shown in FIG. 1.

In a preferred embodiment, as depicted in FIG. 2(c), a further improvement on accuracy is obtained by employing two shadow lines 20a and 20b of different widths to better handle the return current. The return current is not a direct image of the signal line current, but exists over a region that is wider than the original signal line 12a. This width increases as the signal line height above the ground plane, h, increases. Thus, in the modified circuit 100", shown in FIG. 2(c), by including one or more additional shadow lines, such as shadow line 20b at a height hs2 above the ground plane and above shadow line 20a (at a height hs1),and with each shadow line being equal to or having a larger width than the signal line, the superposition of currents on the combination of shadow lines more closely matches the true current. As shown in Figure 2(c), though situated at different heights, the shadow lines 20a and 20b share the same vias 18a,b.

It is understood that the width of the additional shadow lines may vary depending upon the particular signal line structure being modeled, and particularly its distance to the ground plane. In one embodiment, the width of a first shadow line, $w_{sh}$, may be equal to the width of the signal line structure $w_{sig}$, or be equal to the width of the signal line structure $w_{sig}$ plus two times the height h value (distance of signal line from ground plane), i.e., $w_{sh}=w_{sig}+2h$. Any additional shadow lines may have widths geometrically increased by multiples of h, e.g., 2h, 4h 16h, etc. Heights hs of each additional shadow line in the embodiment of FIG. 2(c) are different but negligible, for example, may be equal to multiples of $1\times10^{-4}\times h$.

The improved accuracy made possible by the techniques of the invention depicted in FIGS. 2(a)–2(c) is supported by computer simulations using a conventional 3D package analysis code, e.g., employing method-of-moment techniques. One commercially available analysis program is the "Turbo Package Analyzer" available from Pacific Numerix, the code of which is incorporated herein by reference as if fully set forth herein, and which implements techniques for calculating electrical parameters, e.g., by calculating currents in rectangular sections in the x, y, and z directions. Any numerical analysis program which lends itself to calculating currents in rectangular sections that are parallel and diagonally situated in the x-y plane, may be sufficient for incorporating the method of the invention.

An inductance analysis involving implementation of the package analysis code applied to the example structure of FIG. 1, will now be explained in greater detail. In the example structure 10 of FIG. 1, the ground plane 15 is a 20 cm by 20 cm ground plane that has been uniformly sectioned into a 20-by-20 grid of rectangles (squares) 11. Two parallel signal lines 12a and 12b, each of $10\sqrt{2}$ cm (i.e., 14.14 cm) length and running at a 45 degree angle with respect to the rectangles of the ground plane, are located at a height h=0.1 cm above the ground plane in a first example, and a height h=1.0 cm above the ground plane in a second example. The signals lines 12a and 12b each have width of 0.1 cm and are separated from each other by about 1.414 cm. The modified structure according to the embodiment as depicted in FIG. 2(a) includes two shadow lines lying directly below the signal lines, and four vias (not shown) that tie them (one at each end) to the ground plane.

The results of the various implementations of a 3-D package analysis code with similar capabilities as the above-mentioned analysis code applied to the modified structures for inductance analysis of the example structure of FIG. 1, are shown in the table of FIG. 3. As shown in the analysis in the table of FIG. 3, the self inductances of the signal lines are L11 and L22, and the mutual inductance is L12.

In FIG. 3, using a 2D package analysis code applied to the original (unmodified) structure (FIG. 1) for each of two examples, the first set of results of the 2D analysis in line 40 serves as a first basis for comparison, since the results from the 2D analysis agree fairly closely with that of the actual structure. Lines 45a–45d illustrate the inductance calculations implementing the package analysis code as applied against the original (unmodified) 3D structures, at various grid resolutions. For instance, calculated inductances for the signal lines 12a and 12b at a grid resolution of 1× (line 45b) corresponds to a ground plane grid of 400 rectangles (20× 20) while calculated inductances for the signal lines 12a and 12b at a grid resolution of 0.25× (line 45d) corresponds to a ground plane grid of 80×80. For purposes of description, the results of line 45d, FIG. 3, may be used as a second and preferred basis for comparison, as the grid is sufficiently fine for the calculations to closely approximate the true results.

As shown in FIG. 3, lines 45a–45d, the inductance calculations are much more accurate for the finer grid resolution. It should be understood that for the 2D package analysis code, the ground plane is assumed as infinite in extent, and may be modeled with high accuracy. However, it must be realized that the 2D analysis is not appropriate to analyze structures that have substantial 3D effects and so a 2D code may not, in general, substitute for a 3D code. Thus, in the 3D (unmodified) case according to the first example where the lines are situated h=0.1 cm above the ground plane, the calculations of the self inductances (L11 and L22) for the original structure for a 2× grid are over 80 nH as compared to the 2D result of about 60 nH; this represents an error exceeding 37%. The mutual inductance, L12, is both non-physical (it should not be negative) and in error by an order of magnitude. The error decreases as the grid is made finer, as indicated by the entries corresponding to grids of 1×, 0.5× and 0.25×, lines 45b–45d, respectively, with the 0.25× size grid being the basis for comparison. For the finest grid the results are in good agreement with the 2D analysis; the differences are mostly due to the presence of the vias and various 3D effects included only in the 3D analysis. For the 1× grid, the self inductances are off by about 20% and the mutual inductance off by almost a factor of three.

In the preferred analysis, the structural modifications of the invention are input to the package analysis code. For the first case, according to the modification as shown with respect to FIG. 2(a), the height h of the signal line structures above the ground plane is, e.g., 0.1 cm and, the modified structure includes respective first pair of shadow lines placed at a distance hs=0.00001 cm above the ground plane for each signal line 12a and 12b. For purposes of this analysis, the distance hs is effectively infinitesimal. This structure is referred to as modified_1 with the resulting inductance calculations found in lines 46a and 46b according to the grid resolutions as indicated in FIG. 3. According to the modification as shown with respect to FIG. 2(c), the modified structure includes respective second pair of shadow lines, e.g., situated at 0.00002 cm above the ground plane. This structure is referred to as modified_2 with the resulting inductance calculations being found in lines 48a and 48b according to the grid resolutions indicated in FIG. 3.

As shown in FIG. 3, for the modified_1 structure, the results are far better for the 1× grid. The self inductances for the 1× grid are within about 1% of the actual values (basis of line 45d), and the mutual inductance within 40%. For the modified_2 structure and 1× grid, the self inductances are within a few tenths of a percent and the mutual inductance within 4%. Compared to the original structure analyzed for a 1× grid, the invention clearly yields far superior results. It should be understood that the calculated L11 and L22 values are not the same for each of the original and modified_1 structure and modified_2 structures due to the orientation and placement of the vias in the modified structures and the presence of additional small conductors (not shown) needed to facilitate the analysis.

In view of the example results as shown in FIG. 3, it is understood that the invention has the greatest value in cases where the height of the signal lines is small compared to the grid (cell) size of the ground plane; for the first case, where h=0.1 cm, and the grid size=1 cm, the ratio of height to the grid size is 0.1. Typical PC boards and modules often involve large ground planes (on the order of 10 cm by 10 cm) and this precludes the use of fine grids; signal lines widths and heights are typically a fraction of 1 mm. This means that the 0.1 ratio of the structure considered above is representative of the typical cases in the industry. From the second example, where h=1.0 cm, the grid size is the same, i.e., 1×, the ratio of height to the grid size is 1.0. In this case, the analysis is within a few percent of the 2D values (line 40).

Skilled artisans may readily use the teachings herein to additionally improve upon capacitance calculation of structures. For instance, in the modification of the structure, instead of the shadow lines carrying most of the return current as in the case of the modification when making inductance calculations, the shadow lines support a charge distribution that, combined with the charge distribution in the rectangular cells of the ground plane, more accurately matches the charge distribution in the actual structure. Provision of a via may force the potential of the shadow lines to be the same as that of the ground plane. Actually, only one via per shadow line is required for the capacitance analysis. The capacitance for the original and modified structure (i.e. with shadow lines) is virtually the same, and this occurs because the charges in the shadow lines and ground plane, being only an infinitesimal distance apart, have a superposition that is the same as if this charge were entirely in the ground plane.

The advantage of the invention is that high accuracy may be obtained using the same gridding as for an entirely rectangular structure, i.e., one without diagonal lines. Faster and more efficient solutions are possible and larger, more complex structures may be analyzed. Further, the same solution techniques and computer codes can be used for structures with or without diagonal lines.

While the invention has been particularly shown and described with respect to illustrative and preformed embodiments thereof, it will be understood by those skilled in the art that the foregoing and other changes in form and details may be made therein without departing from the spirit and scope of the invention which should be limited only by the scope of the appended claims.

What is claimed is:

1. A method for calculating electrical circuit parameters in a circuit to be analyzed, said circuit including a signal line structure capable of carrying current and a ground plane having a return current, said method including:

locating one or more signal line structures each for carrying current near a ground plane, said signal line structures located a height h relative to said ground plane;

associating one or more shadow line structures with each signal line structure and locating said one or more shadow line structures to run in parallel with said signal line structure between said ground plane and its associated signal line structure;

providing for each shadow line structure a first via structure for connecting a first end of said shadow line structure to said ground plane and, a second via structure connecting a second end of said shadow line structure to said ground plane, said associated shadow line structure and respective first and second vias permitting a re-distribution of said return current between said ground plane and said shadow line structure in a subsequent electrical circuit parameter calculation performed by a circuit analysis program, said return current substantially comprised within said shadow line structure;

inputting said ground plane, signal line structure, shadow line structure, respective first and second via structures and re-distributed return current into said circuit analysis program for performing said electrical circuit parameter calculation for a portion of said circuit comprising said signal line structure and said ground plane;

wherein said electrical circuit parameter is calculated with improved accuracy due to the return current being re-distributed to said shadow line structure.

2. The method as claimed in claim 1, wherein said signal line structure is situated at an angle relative to said ground plane.

3. The method as claimed in claim 1, wherein said shadow line structure is located an infinitesimal distance above or below said ground plane structure.

4. The method of claim 1, wherein a height h of said signal line structure above said ground plane determines a width of its corresponding shadow line structure.

5. The method as claimed in claim 1, wherein said first and second via structures have a length running orthogonal to said ground plane.

6. The method as claimed in claim 5, wherein said signal line structure is a conductor having width and length dimensions, each shadow line structure being a conductor having the same width as said signal line structure and having infinitesimal thickness.

7. The method as claimed in claim 5, wherein each shadow line structure is a conductor having a different width than that of said corresponding signal line structure and having infinitesimal thickness.

8. The method as claimed in claim 5, wherein an electrical parameter calculation includes an inductance calculation of said signal line structure.

9. The method as claimed in claim 8, wherein said analysis program includes technique for partitioning said ground plane into a rectangular grid, each rectangle of said grid having orthogonal current distributions used in calculation of said return current in said ground plane.

10. The method as claimed in claim 1, wherein said electrical parameter calculation includes a capacitance calculation of said signal line structure, said shadow line structure including a via structure connecting one end of said shadow line structure to said ground plane structure.

11. The method as claimed in claim 1, wherein said ground plane has a thickness and includes top and bottom surfaces, said associating step including associating two shadow line structures for a signal line structure, a first shadow line structure being located above a top surface of said ground plane and below said signal line structure, and a second shadow line structure being located below a bottom surface of said ground plane running parallel to said signal line structure, each first and second shadow line structure having respective via structures at corresponding first and second ends for connecting to said ground plane.

12. The method as claimed in claim 1, wherein said ground plane includes an aperture resulting in two conductive ground plane regions, said associating step including locating a first shadow line structure over a first conductive region of said ground plane, and locating a second shadow line structure over a second conductive region of said ground plane.

13. The method as claimed in claim 1, wherein said signal line structure includes two or more non-intersecting signal lines situated diagonally with respect to said ground plane and crossing each other, said method including associating one or more shadow line structures for each signal line structure at different heights in a manner so that said shadow structures do not intersect.

14. The method as claimed in claim 1, wherein said signal line structure includes two or more conductors situated diagonally with respect to said ground plane and intersecting each other, said method including associating one or more shadow line structures for each conductor at different heights, and providing a via for each shadow line structure at a location corresponding to the intersection of said conductors.

15. A program storage device readable by a machine, tangibly embodying a program of instructions executable by the machine to perform method steps for calculating electrical circuit parameters in a circuit device to be analyzed, said circuit device including a signal line structure capable of carrying current and a ground plane having a return current, said method steps comprising:

locating one or more signal line structures each for carrying current near a ground plane and located a height h relative to said ground plane;

associating one or more shadow line structures with each signal line structure and locating said one or more shadow line structures to run in parallel with said signal line structure between said ground plane and its associated signal line structure;

providing, for each shadow line structure, a first via structure for connecting a first end of said shadow line structure to said ground plane and, a second via structure connecting a second end of said shadow line structure to said ground plane, said associated shadow line structure and respective first and second vias permitting a re-distribution of said return current between said ground plane and said shadow line structure in a subsequent electrical circuit parameter calculation performed by a circuit analysis program, said return current substantially comprised within said shadow line structure;

inputting said ground plane, signal line structure, shadow line structure, respective first and second via structures and re-distributed return current into said circuit analysis program for performing said electrical circuit parameter calculation for a portion of said circuit comprising said signal line structure and said ground plane;

wherein said electrical circuit parameter is calculated with improved accuracy due to the return current being re-distributed to said shadow line structure.

16. The program storage device readable by a machine as claimed in claim 15, wherein said signal line structure is situated at an angle relative to said ground plane.

17. The program storage device readable by a machine as claimed in claim 15, wherein said shadow line structure is located an infinitesimal distance above or below said ground plane.

18. The program storage device readable by a machine as claimed in claim 15, wherein a height h of said signal line structure above said ground plane determines a width of its corresponding shadow line structure.

19. The program storage device readable by a machine as claimed in claim 15, wherein said first and second via structures have a length running orthogonal to said ground plane.

20. The program storage device readable by a machine as claimed in claim 19, wherein said signal line structure is a conductor having width and length dimensions, each shadow line structure is a conductor having the same width as said signal line structure and having infinitesimal thickness.

21. The program storage device readable by a machine as claimed in claim 19, wherein each shadow line structure is a conductor having a different width than that of said corresponding signal line structure and having infinitesimal thickness.

22. The program storage device readable by a machine as claimed in claim 19, wherein said electrical parameter calculation includes an inductance calculation of said signal line structure.

23. The program storage device readable by a machine as claimed in claim 22, wherein said analysis program includes technique for partitioning ground plane into rectangular grid, each rectangle of said grid having orthogonal current distributions used in calculation of return current distribution in said ground plane.

24. The program storage device readable by a machine as claimed in claim 19, wherein said electrical parameter calculation includes a capacitance calculation of said signal line structure, said shadow line structure including a via structure connecting one end of said shadow line structure to said ground plane structure.

25. The program storage device readable by a machine as claimed in claim 19, wherein said ground plane has a thickness and includes top and bottom surfaces, said associating step including associating two shadow line structures for a signal line structure, a first shadow line structure being located above a top surface of said ground plane and below said signal line structure, and a second shadow line structure being located below a bottom surface of said ground plane running parallel to said signal line structure, each first and second shadow line structure having respective first and second ends, each first and second shadow line structure having first and second via structures at respective first and second ends for connecting to said ground plane.

26. The program storage device readable by a machine as claimed in claim 19, wherein said ground plane includes an aperture resulting in two conductive ground plane regions, said associating step including locating a first shadow line structure over a first conductive region of said ground plane, and locating a second shadow line structure over a second conductive region of said ground plane.

27. The program storage device readable by a machine as claimed in claim 19, wherein said signal line structure includes two or more non-intersecting signal lines situated diagonally with respect to said ground plane and crossing each other, said method steps including associating one or more shadow line structures for each signal line structure at different heights in a manner so that said shadow line structures do not intersect.

28. The program storage device readable by a machine as claimed in claim 19, wherein said signal line structure includes two or more conductors situated diagonally with respect to said ground plane and intersecting each other, said method steps including associating one or more shadow line structures for each conductor at different heights, and providing a via for each shadow line structure at a location corresponding to the intersection of said conductors.

\* \* \* \* \*